United States Patent [19]

Kormos et al.

[11] Patent Number: 4,661,775

[45] Date of Patent: Apr. 28, 1987

[54] CHEMICAL SHIFT IMAGING WITH FIELD INHOMOGENEITY CORRECTION

[75] Inventors: Donald W. Kormos, Parma; Hong-Ning Yeung, Richmond Heights; Henry S. Dewhurst, Cleveland Heights, all of Ohio

[73] Assignee: Technicare Corporation, Solon, Ohio

[21] Appl. No.: 755,120

[22] Filed: Jul. 15, 1985

[51] Int. Cl.$^4$ ............................................. G01R 33/20
[52] U.S. Cl. ....................................... 324/307; 324/312
[58] Field of Search ............... 324/300, 307, 308, 309, 324/310, 311, 312

[56] References Cited

U.S. PATENT DOCUMENTS

| | | | |
|---|---|---|---|
| 4,068,161 | 1/1978 | Ernst | 324/312 |
| 4,361,807 | 11/1982 | Burl et al. | 324/309 |
| 4,553,096 | 11/1985 | Randell | 324/309 |
| 4,581,582 | 4/1986 | Redington | 324/309 |
| 4,585,992 | 4/1986 | Maudsley et al. | 324/312 |

OTHER PUBLICATIONS

Thomas W. Dixon, Simple Proton Spectroscopic Imaging, Radiology, vol. 157, No. 1, Oct. 1984, pp. 189-194.
Thomas W. Dixon, and David D. Faul, Proton Spectroscopic Imaging, Third Annual Meeting of the SMRM, Aug. 13-17, 1984, pp. 193-194.
P. Margosian and J. Absrt, Rapid Measurement of Magnetic Field Inhomogeneities Using Imaging Techniques, Third Annual Meeting of the SMRM, Aug. 13-17, 1984, pp. 495-496.
A. A. Maudsley and S. K. Hilal, Field Inhomogeneity Correction and Data Processing for Spectroscopic Imaging, Magnetic Resonance in Medicine, vol. 2, 1985, pp. 218-233.

Primary Examiner—Michael J. Tokar
Attorney, Agent, or Firm—W. Brinton Yorks, Jr.

[57] ABSTRACT

In an NMR system, two chemical shift components are separated by correcting NMR data for field inhomogeneity. A first image data set is acquired which contains no chemical shift information or field inhomogeneity. A second image data set is acquired which contains both chemical shift information and field inhomogeneity. A third image data set is acquired which contains field inhomogeneity information. The first and third image data sets are combined to identify the field inhomogeneity information. This intermediate field image is then used to correct the second image data set for field inhomogeneity. The first image data set and corrected second image data set may then be combined by magnitude reconstruction of complex sums and differences to separate the two chemical shift components.

24 Claims, 13 Drawing Figures

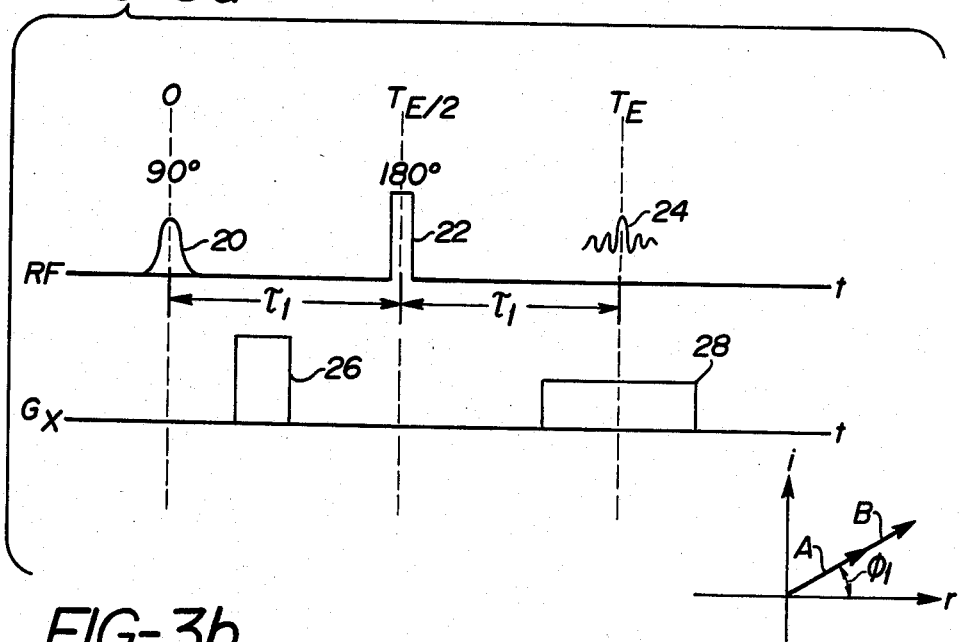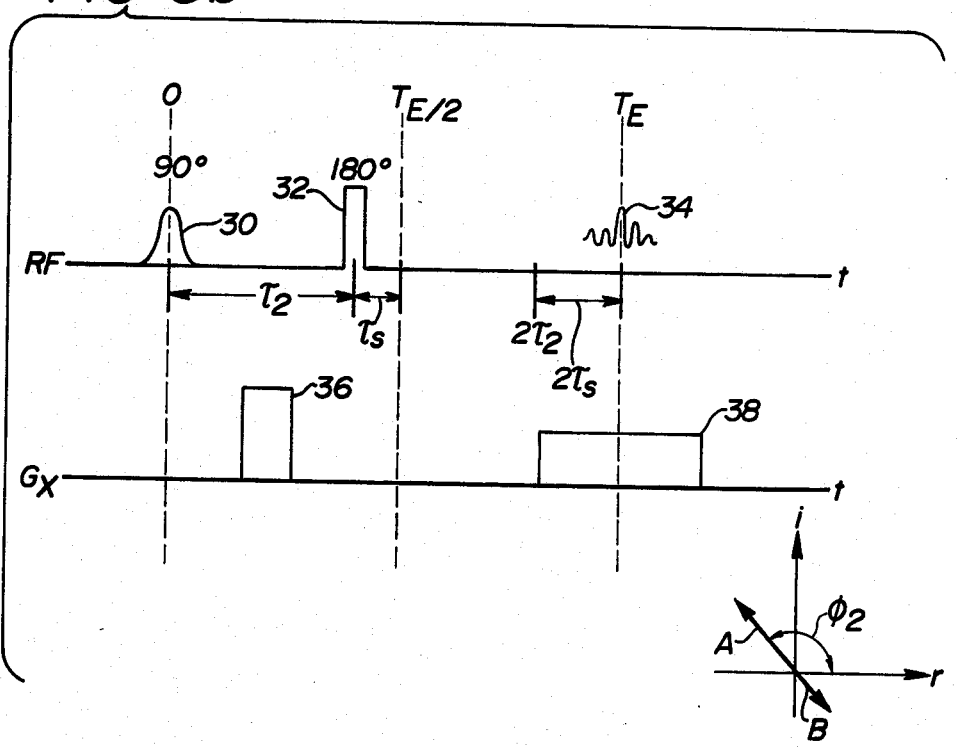

CHEMICAL SHIFT IMAGING WITH FIELD INHOMOGENEITY CORRECTION

This invention relates to nuclear magnetic resonance (NMR) imaging and, in particular, to the formation of NMR images of two chemical shift components.

In NMR spectroscopy, a given species of nucleus in different chemical environments, either in different molecules or in different chemical positions in the same molecule, will give rise to a set of resonance lines, each of which corresponds to each chemically distinct position. The physical origin of this locational displacement of a resonance signal for a distinct chemical environment is the surrounding electrons of the nucleus.

If any atom or molecule is placed in a magnetic field, the induced orbital motion of its electrons produces a secondary magnetic field which also will act on all the nuclei present. Since the induced currents are proportional to the applied magnetic field $B_o$, the magnitude of this secondary field will also be proportional to $B_o$. The effect of this local electron screening or shielding upon the nuclei at different chemical positions is to cause a shift in field strength from $B_o$, termed chemical shift. Since this field shift is proportional to $B_o$ and is most often diamagnetic, it is customarily written as $-\sigma B_o$ where $\sigma$ is a nondimensional constant independent of $B_o$ but dependent on the chemical environment. The magnitude of $\sigma$ varies from about $10^{-5}$ (10 ppm) for protons to values of about $10^{-2}$ (10 parts per thousand) for heavy atoms.

In NMR imaging of human and animal anatomy it is often desirable to form images which represent the chemical shift components of tissue. For instance, diagnostically useful information may be gained if one could distinguish the relative presence of fat and water in the region being imaged. Preferably, a first image would be formed of a plane of the body showing only the varying content of fat in the plane. A second image would be formed showing only the content of water in the plane. Comparison of the two images would yield clinically useful information about the region being examined.

In present conventional NMR imaging systems, image information is collected by the acquisition of spin echo signals. Spin echo signals are generated by first tipping the spin isochromats, or spin vectors, with a 90° radio frequency (RF) pulse into a plane transverse to the static magnetic field. After a period of delay $\tau$, the spin components having different frequencies have begun to dephase, or spread out in the transverse plane. The spins are then flipped in the transverse plane with a 180° RF pulse. This reverses the trajectories of all the spin isochromats causing them to rephase to form a spin echo signal (SE). The spin echo signal intensity peaks around a time $2\tau$ after the initial 90° pulse when the rephasing is completed. This echo data is normally sampled for a duration or sampling window period centered around time $2\tau$.

In imaging experiments, spin dephasing and rephasing can also be affected by the application of magnetic field gradients, the presence of which is required to enable spatial information to be encoded in the NMR signal. As a result, spin echo signals can be produced by applying magnetic field gradients in a controlled manner. For instance, after the spin vectors are brought to the transverse plane by a 90° RF pulse, if one turns on a field gradient for a short duration, the spin isochromats at different locations along the direction of the gradient will be dephased by the field gradient pulse. In rephasing the isochromats to form an echo, one could either reverse the gradient sense or turn the gradient back on in the same direction after a 180° RF pulse. At a time $T_E$ after the 90° pulse when the time integral of the rephasing gradient exactly balances the time integral of the dephasing gradient, a gradient spin echo signal (GSE) is formed. An alternate means of obtaining NMR data is to collect FID signal data using gradient reversals. The FID (free induction decay) signal from the time $T_E$ and on is recorded during a steady "read" or frequency encoding gradient. In practice, since the read gradient cannot be turned on instantly, it is normally switched on at an earlier time than $T_E$. Its direction is then reversed and brought to the steady value before $T_E$. By adjusting the timing and the magnitude of the reversal gradient, the spin isochromats along the direction of the gradient can be refocused at $T_E$. In a normal imaging experiment the echo center of the GSE is normally made coincidental with the echo center of SE, i.e., $T_E = 2\tau$.

For normal applications of NMR imaging, the images obtained from SE signals have a distinct advantage over those obtained from FID signals. In both cases, the chemical shift and field inhomogeneity information will be completely masked by the applied field gradient. Their only effects will be manifested as chemical shift and field inhomogeneity artifacts. These artifacts are more severe for images formed from FID signals after gradient reversal as compared to those formed from SE signals. While both types of images suffer from geometrical as well as intensity distortion caused by field nonuniformity and pixel mis-registration caused by chemical shifts, the images of the FID signals suffer an additional phase distortion which stems from the dephasing effects of field inhomogeneities during the time required to spatially encode and refocus the spin isochromats. Moreover, the asymmetrical nature of FID signals mandates the use of phase-sensitive image reconstruction, whereas the symmetrical nature of the SE signals permits the use of magnitude reconstruction.

To obtain chemical shift and/or field inhomogeneity information, one straightforward solution is to turn off the magnetic field gradient during echo formation. By doing so, one simply uses the time domain signal to represent the chemical shift/field inhomogeneity rather than geometrical information as one would have obtained if the magnetic field gradient had been applied.

For systems with only two chemical shift components, the above procedure is too inefficient. W. T. Dixon has recently proposed a simple and elegant method to provide chemical shift information for the two components. First he recognized that if the sampling window is centered around $T_E$ and if the 180° pulse is so placed that the SE and the GSE are coincidental, then the two chemical shift components will always be in phase at the echo center $T_E$. Dixon's contribution was to then shift the 180° pulse in time by such an amount that $T_E$ and $2\tau$ are no longer coincident, but differ by a time $2\tau_s$. Under these circumstances, the samples echo signal, with the sampling window still centered at $T_E$, will have, at time $T_E$, the two chemical shift component phase-shifted relative to each other. In addition, there will be a phase factor term $e^{i\phi}$ where $\phi$ is proportional to the product of $2\tau_s$ and the field inhomogeneity. If $\tau_s$ is adjusted such that the two components are 180° out-of-phase, the contributions of the two components to the image intensity can be, to some extent, separated by the following means.

By collecting two image data sets, one with the normal method with the SE and GSE coincidental, that is, $T_E=2\tau$, and the other with the 180° pulse time shifted by such an amount that the two chemical shift components are phase-shifted by 180° at time $T_E$, Dixon showed that by reconstructing these two data sets in magnitude the two chemical shift components can be separated within the image on a pixel-by-pixel basis by taking the sums and differences of these two images. The magnitude reconstruction is necessary to circumvent the problem of field nonuniformity.

In a perfectly uniform magnetic field, the Dixon technique would enable one to form two separate images, of water and fat, for instance. However, field inhomogeneities are always present in NMR systems due to various sources. In using magnitude images, the problem of field nonuniformity is bypassed. But magnitude images present a problem, much like the one encountered in $T_1$ determination using magnitude data from an inversion-recovery experiment: the sign of each data point is lost. As a result, the two components are not then segregated into two separate images. Instead, one image depicts the more plentiful component at each pixel, while the other depicts the less plentiful component. For convenience, the more plentiful component image will be referred to hereafter as the major component image and the less plentiful the minor image. While Dixon's technique is an excellent advance in chemical shift imaging, it falls short of being able to present truly separate images of the two components in a typical magnetic field with field inhomogeneities.

In accordance with the principles of the present invention, a technique is provided for forming truly separate NMR images of two chemical shift components. In one embodiment, a conventional spin echo experiment is performed in which spin echo signals are generated with the SE and GSE being coincident in time. Two further spin echo experiments are performed, each with their 180° RF pulses time shifted with respect to $\frac{1}{2}T_E$ such that, at time $T_E$, the two chemical shift components are phase shifted with respect to each other by different multiples of ninety degrees. After conventional image reconstruction of the acquired NMR signal information, the three images are each represented by spatially variable complex numbers of the general form:

$$(f_A + f_B e^{i\theta})(e^{i\phi})$$

where $f_A$ and $f_B$ are the relative weightings of the chemical shift components, $\theta$ is the relative phase angle of the two components, and $\phi$ is a spatially dependent phase angle which can be a function of instrumentation errors and local field inhomogeneity.

The three images exhibit three different types of information content. The conventional spin echo image contains virtually no chemical shift and field inhomogeneity information, but may contain an instrumentation error phase angle. The second image contains chemical shift and field inhomogeneity information, and may also contain an instrumentation error phase angle. The third image contains field inhomogeneity information and an instrumentation error phase angle comparable to that of the first image. By combining the information of the first and third images the field inhomogeneity information can be determined. This field inhomogeneity information is then used to correct the second image, removing field non-uniformity factors from its image content.

The corrected second image is combined with the first image to separately identify the chemical shift components.

The phase correction can be performed using a phantom object, if desired, or by use of the imaging object in situ. The principles of the present invention are also applicable to in situ or phantom magnetic field mapping.

In the drawings:

FIG. 3 illustrates pulse sequences and spin vectors used to perform chemical shift imaging in accordance with the Dixon technique;

Figure 9:
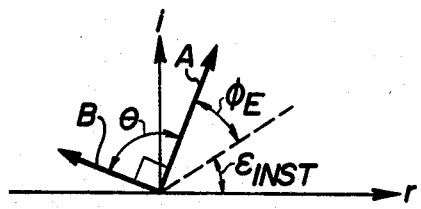

FIG. 9 vectorially represents chemical shift component vectors in phase quadrature orientation for chemical shift imaging.

Figure 1:
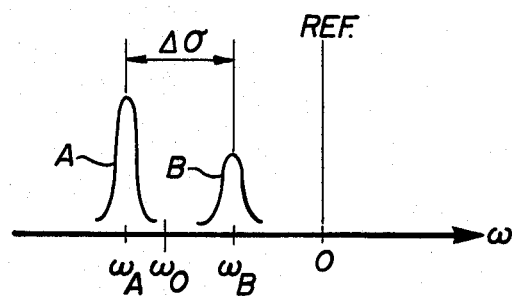
FIG. 1 illustrates two chemical shift components which are to be separately imaged.

Referring to FIG. 1, two chemical shift components A and B are represented which are to be imaged. In proton images taken of a plane of a human or animal subject, for instance, imaging components A and B may be water and fat. The presence of water may be indicated by resonance of the hydrogen protons in the $H_2O$ molecule, and the presence of fat may be indicated by resonance of the hydrogen protons of the methylene component ($-CH_2-$) of fat. A typical resonance line for water is shown in FIG. 1 of frequency $\omega_A$, which is approximately 4.8 part per million (ppm). A resonance line for fat is given at frequency $\omega_B$ as approximately 1.3 ppm. Both resonance lines are relative to a tetramethyl silane (TMS) reference line indicated as REF. In NMR imaging, it is the relation of the two chemical shift components to each other, in this case a separation of 3.5 ppm, which is significant. This difference in chemical shift can be generally expressed as $\Delta\sigma$. A reference frequency for the NMR imaging apparatus, $\omega_o$, is also shown in the FIGURE. Its position is arbitrarily shown between the two components and closer to the A component.

Figure 2:
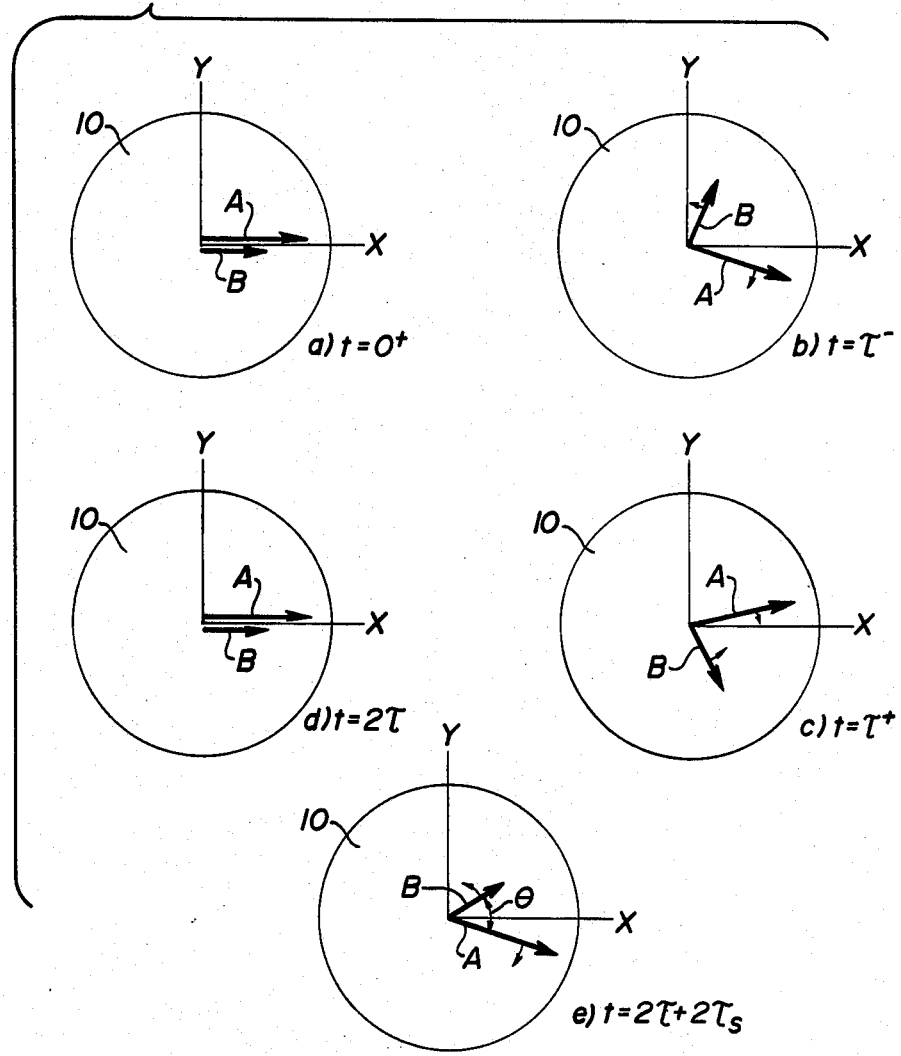
FIG. 2 illustrates spin isochromats in various stages during chemical shift imaging.

FIG. 2 illustrates the various positions of the A and B component spin vectors during an experiment in accordance with the Dixon technique of chemical shift imaging. In illustrations (a) through (e) of FIG. 2, x and y coordinate axes are shown for a transverse (x−y) plane 10 of a rotating reference frame. The z axis extends perpendicular to the drawings. Illustration 2(a) shows the A and B vectors at time $t=0^+$, the moment immediately after the vectors have been tipped from alignment with the z axis and the static magnetic field to the transverse plane by a 90° pulse applied along the −y axis. After a time $\tau^-$ the vectors have rotated in the transverse plane as shown in FIG. 2(b). Since the reference frequency $\omega_o$ is between the two components they will precess in opposite directions as shown by the small rotational arrows on each vector. And since the B component is more widely separated from the $\omega_o$ reference frequency than the A component, the B component will precess faster than the A component.

At the $t=\tau^+$ immediately after a 180° pulse along the $+x$ axis that two vectors are precessing back toward the x axis, as shown in FIG. 2(c). As the small rotational arrows indicate, the respective directions of precession have not changed. At time $t=2\tau$, the vectors assume a position of alignment along the x axis as shown in FIG. 2(d), at which time a normal spin echo signal may be detected. The vectors then continue their precessional speeds and directions until at a time $t=2\tau+2\tau_s$ the vectors are located as shown in FIG. 2(e). At this time the A and B vectors are separated by an angle $\theta$. The angle $\theta$ is determined by the expression $$\theta = 2\tau_s(\Delta\sigma)\omega_o.$$

Since all the terms on the right side of the expression are known, they can be chosen to give a known angle $\theta$. In Dixon's experiment, $2\tau_s$ is chosen in conjunction with the reference frequency $\omega_o$ and the chemical shift $\Delta\sigma$ to give an angle $\theta$ equal to 180°.

Referring to FIG. 3, pulse sequences are shown which may be used to perform a Dixon type chemical shift experiment. In a first sequence of data acquisition a 90° RF pulse 20 is applied to a subject in the static magnetic field. Thereafter a first $G_x$ gradient pulse 26 is applied, which has an integral value equal to that of the subsequent "read" gradient 28 up to the point in time $T_E$. At a time $\tau_1$ later than the 90° pulse 20, a 180° RF pulse 22 is applied to generate a spin echo signal. The spin echo signal 24 is centered around a point in time which is $\tau_1$ later than the 180° RF pulse 22. The spin echo signal is sampled in the presence of the $G_x$ read gradient 28. This sequence is repeated with variation for subsequent Fourier transform processing of the acquired data and image formation. Each acquired signal represents the vector sum shown at the bottom of FIG. 3a, where the magnitudes of the A and B vectors are aligned with each other and are offset from the real axis r of the complex plane i−r by an angle $\phi_1$, an instrumental phase factor which is generally spatially nonuniform.

A second sequence of data acquisition is illustrated in FIG. 3b. A 90° RF pulse 30 is applied to the subject, followed by a $G_x$ gradient pulse 36. At a time $\tau_2$ following the 90° pulse 30 a 180° RF pulse 32 is applied. A time $\tau_s$ after the 180° RF pulse 32 marks the middle of the interval between the 90° pulse 30 and the subsequent spin echo signal, $\frac{1}{2}T_E$. Finally, at a time $T_E$, which is equal to $2\tau_2+2\tau_s$, the spin echo signal 34 develops, which is sampled in the presence of the $G_x$ read gradient 38. The $2\tau_s$ time is chosen such that $\theta$ is equal to 180° ($\pi$ radians) in the above expression. As shown at the bottom of FIG. 3b, the A and B vectors at time $T_E$ are at an angle of 180° to each other and are rotated from the real axis by an angle $\phi_2$. This phase angle is the sum of $\phi_1$ and another phase angle representing static field inhomogeneity. The sequence of FIG. 3b is repeated a sufficient number of times with variations for the acquisition of data for subsequent Fourier transform processing and image formation.

Mathematically the spin echo data acquired in the sequences of FIG. 3 is of the form:

$$(f_A + f_B \exp\{i\theta\}) \exp\{i\gamma E(x,y)2\tau_s\} \exp\{i\phi_1\}$$

where $\theta$ is the vector angle of the previous expression, $\gamma$ is the gyromagnetic ratio, and $E(x,y)$ is the spatially dependent field inhomogeneity. Terms $f_A$ and $f_B$ are the weighting factors of the two chemical shift components which depend upon their concentrations as well as relaxation time. In the FIG. 3a sequence where $\theta$ is equal to zero as $\tau_s$ is zero, the above expression reduces to $(f_A + f_B)e^{i\phi_1}$. In the FIG. 3b sequence where $\theta$ is equal to 180° and $\tau_s$ is the value necessary for $\theta=180°$, the above expression reduces to the complex expression $$(f_A - f_B)\exp\{i\gamma E(x,y)2\tau_s\} \exp\{i\phi_1\} = (f_A - f_B)e^{i\phi_2}$$

As the vector illustrations of FIG. 3 show, angles $\phi_1$ and $\phi_2$ differ from each other. Moreover, $E(x,y)$ is seen to be a function of spatial location, x and y. This is because the field inhomogeneity can vary in the static magnetic field from one spatial location to another. Thus, $E(x,y)$ cannot be determined in the above expression because, in the case where $f_A$ equals $f_B$, the second expression is equal to zero: there is no signal to measure. To form an image, then, Dixon's technique multiplies the above expression by its complex conjugate to eliminate the exponential terms, which gives a value $|A-B|$. The major (sum) image and the minor (difference) image are then formed from the magnitudes:

Major Image = $|A+B| + |A-B|$ = > the larger of A or B

Minor Image = $|A+B| - |A-B|$ = > the smaller of A or B

Figure 4:
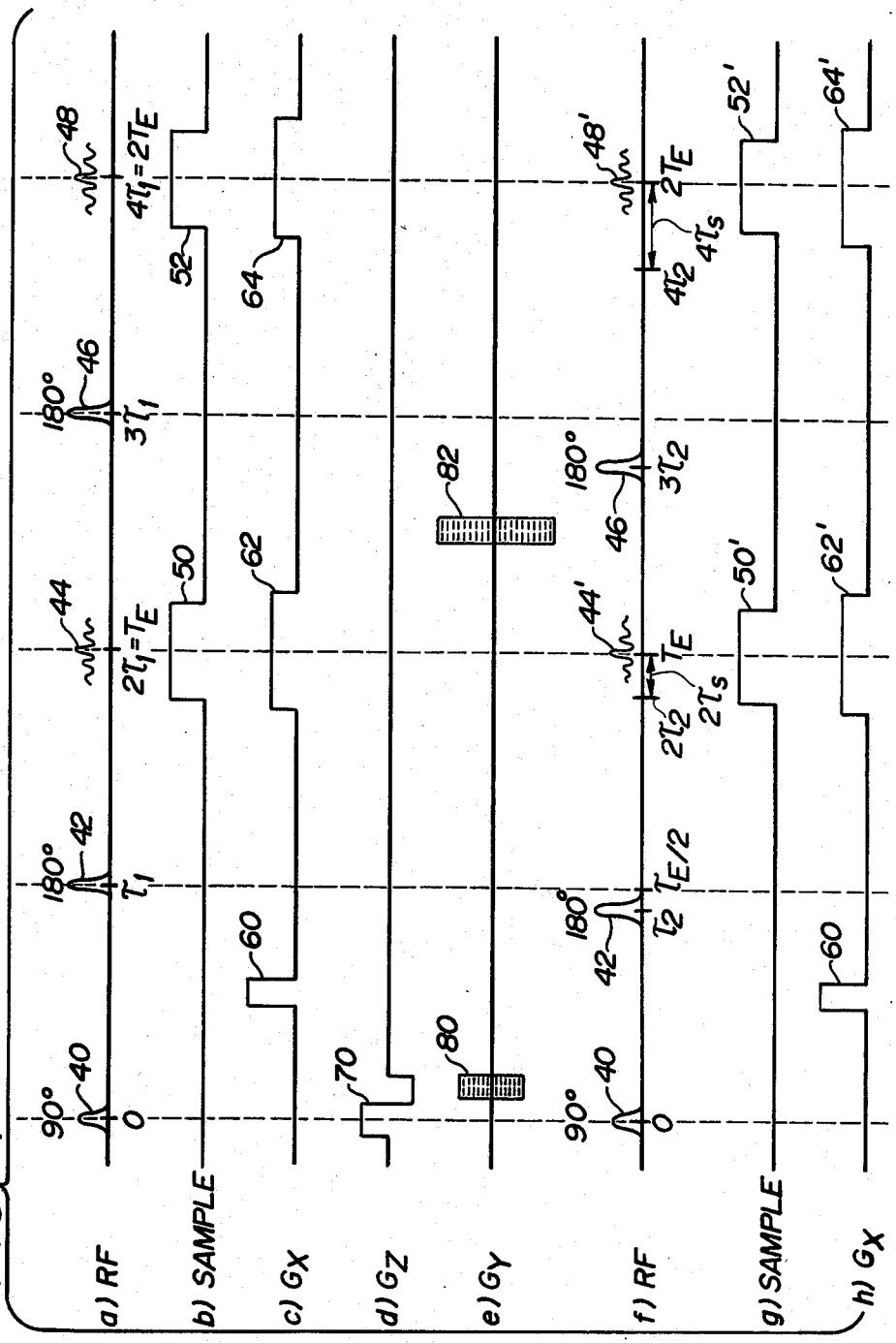
FIG. 4 illustrates pulse sequences used to perform chemical shift imaging in accordance with the principles of the present invention.

In accordance with the principles of the present invention, separate images of the A and B chemical shift components are formed using the sequences of FIG. 4. In this FIGURE, lines (a) through (e) represent a first sequence and lines (d) through (h) represent a second sequence. In the first sequence a standard two echo experiment is performed. A 90° RF pulse 40 is applied to the subject in the presence of a $G_z$ gradient 70 for selecting the planar slice which is to be imaged. After the 90° pulse, an amplitude variable $G_y$ gradient 80 is applied and a $G_x$ gradient 60 is applied. At time $\tau_1=T_E/2$ a 180° RF pulse 42 is applied to the subject for the formation of a first spin echo signal 44 centered around time $2\tau_1$. The spin echo signal 44 is sampled during the sampling period 50 in the presence of a $G_x$ read gradient 62. After the spin echo signal 44 is acquired a second amplitude variable $G_y$ gradient 82 is applied. At time $3\tau_1$ a second 180° RF pulse 46 is applied to the subject to produce a second spin echo signal 48 centered around time $4\tau_1=2T_E$. The second spin echo signal 48 is sampled during the sampling period 52 in the presence of a $G_x$ read gradient 64.

The first sequence is repeated numerous times to acquire sufficient data for subsequent Fourier transformation, each time varying the amplitudes of the $G_y$ gradients 80 and 82.

The pulses and gradients of the second sequence are similar to those of the first, up until the time of application of the first 180° pulse 42. This pulse is applied at time $\tau_2$, which is earlier than $T_E/2$ by a time $\tau_s$. The desired first spin echo signal 44′ is centered in time around time $T_E$, which is $2\tau_s$ in time later than time $2\tau_2$. The spin echo signal 44′ is sampled during a sampling period 50′ in the presence of a $G_x$ read gradient 62′. The following $G_y$ gradient 82 and 180° pulse 46 are applied as in the first sequence, except for the earlier occurrence of the 180° pulse 46 at time $3\tau_2$. Again the time of acquisition of the next spin echo signal is changed. The spin echo signal 48′ is centered in time at time $2T_E$, which is $4\tau_s$ later than time $4\tau_2$. The spin echo signal 48′ is sampled during period 52′ in the presence of $G_x$ read gradient 64′.

As in the first sequence, the second sequence is repeated with variation of $G_y$ gradient amplitudes 80 and 82 for subsequent Fourier transform processing.

It should be noted that the $\tau_s$ delay can be either positive or negative with respect to multiples of $T_E/2$. In the second sequence of FIG. 4 for instance, 180° pulse 42 occurs at time $(T_E/2)-\tau_s(=\tau_2)$. Pulse 42 could also occur at time $(T_E/2)+\tau_s$, which would cause time $2\tau_2$ to occur at time $T_E+2\tau_s$. The spin echo signal 44′ would continue to be centered at time $T_E$, which is equal to $2\tau_2-2\tau_s$. Correspondingly, spin echo signal 48′ would then be centered at time $4\tau_2-4\tau_s$.

The characteristics of the complex images formed by spin echo signals 44, 48, 44′, 48′ are vectorally represented in FIGS. 5a–5d. The magnitudes of each component A and B are shown as vectors in a complex plane. The angles $\epsilon_{INST}$ and $\epsilon'_{INST}$ shown are instrumental phase delays caused by RF absorption of the subject as well as eddy current effects of gradient switching. $\phi_E$ is an additional phase angle caused by static field inhomogeneity. The component magnitudes A and B, as well as the phase angles $\epsilon_{INST}$ and $\epsilon'_{INST}$, and $\phi_E$ are spatially dependent.

Figure 5A:
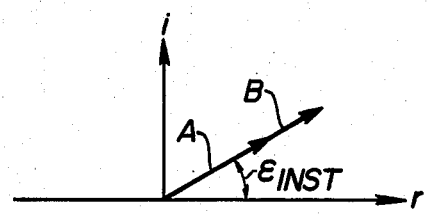
FIG. 5 illustrates chemical shift component vectors during various stages of the chemical shift imaging experiment of FIG. 4.
Figure 5B:
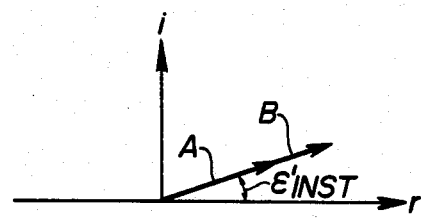
Figure 5C:
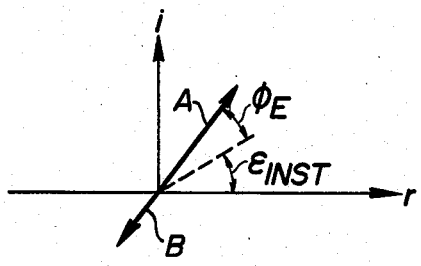
Figure 5D:
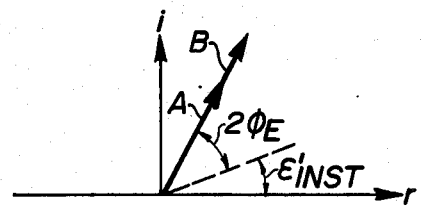

In FIG. 5a representing spin echo signal 44, the A and B spin components are in alignment (in-phase) and make an angle $\epsilon_{INST}$ relative to the real axis of the complex plane. Similarly, FIG. 5b represents spin echo 48. The A and B spin vectors are again aligned but rotated from the real axis by a different phase angle, $\epsilon'_{INST}$. FIG. 5c depicts spin echo signal 44′. With $\tau_s$ chosen for a 180° angle between the spin components A and B, the vectors are shown as antiparallel, or 180° out-of-phase. The phase angle relative to the real axis is now the sum of $\epsilon_{INST}$ (as in FIG. 5a) and $\phi_E$, a phase angle due to field inhomogeneity with the 180° pulse displaced from the $T_E/2$ time by $\tau_s$. In FIG. 5d, the spin vectors A and B are once again in phase (360° out-of-phase) but rotated from the real axis by $\epsilon'_{INST}$ and $2\phi_E$. In this case, the 180° pulse is displaced from $T_E/2$ by time $3\tau_s$. The $\epsilon'_{INST}$ angle is the same phase angle shown in FIG. 5b since both represent the second echo of a two each sequence. Relative to FIG. 5c, twice the field inhomogeneity phase, $2\phi_E$, is also shown.

One objective of the present invention is to remove the field inhomogeneity phase angle, $\phi_E$, from the complex image represented by FIG. 5c. This will allow separation of the desired A and B component images by the complex sum and difference of images represented by FIG. 5a and a corrected FIG. 5c image. A complex image with the A and B components in-phase and rotated from the real axis by $\phi_E$ can mathematically be obtained from the second echo images depicted in FIGS. 5b and 5d. This intermediate image can then be used to remove the $\phi_E$ rotation in the complex image diagrammed in FIG. 5c. This intermediate image in fact represents an in situ image of the static field inhomogeneity on a pixel-by-pixel basis.

It should be noted that the information of FIGS. 5a and 5c alone cannot be used to identify and remove the $\phi_E$ rotation. This is because the A and B components of the two images are in-phase and out-of-phase. The $\phi_E$ rotation can be identified when the other components of the complex images, including the A and B vector alignment and $\epsilon_{INST}$ phase errors, are in correspondence and will cancel through complex division. That is the case in FIGS. 5b and 5d, which differ only in the field inhomogeneity component $2\phi_E$.

Figure 6:
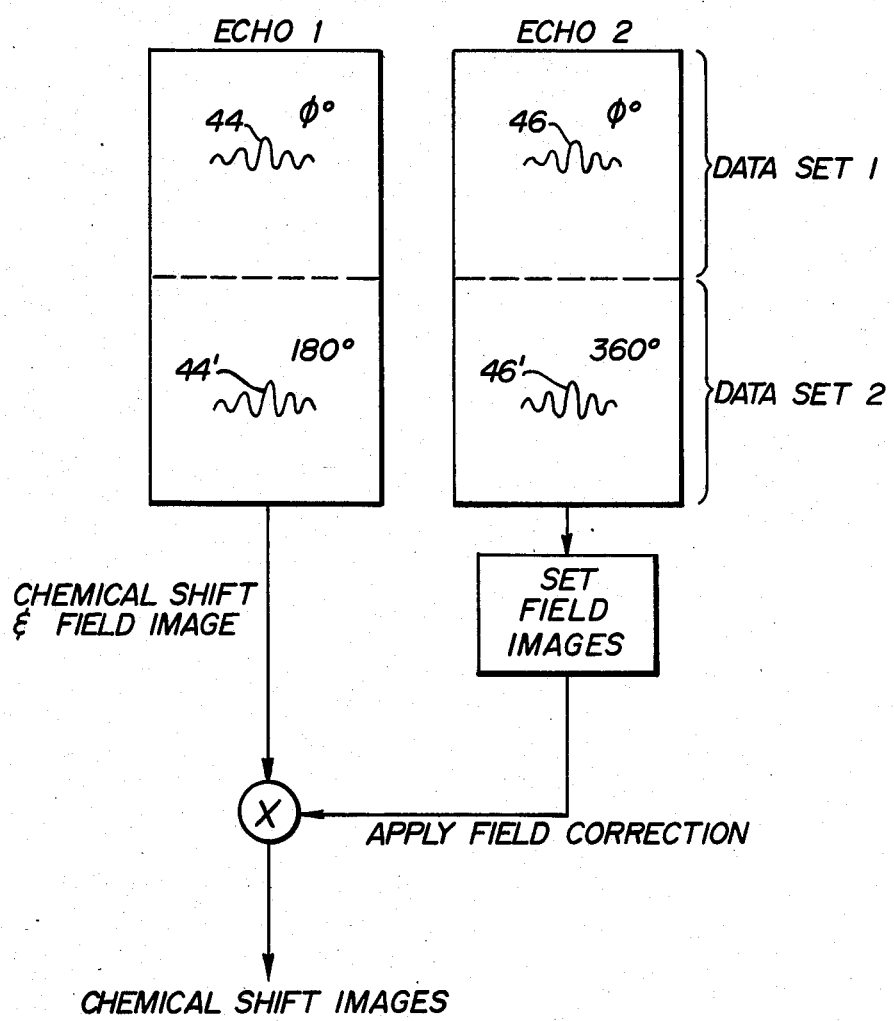
FIG. 6 is a flowchart of the processing used to form images of the two chemical shift components of FIG. 1 in accordance with the principles of the present invention.

In a constructed embodiment of the present invention the spin echo signal information is processed as indicated in the flowchart of FIG. 6. Spin echo signal information from the first sequence of FIG. 4 is stored as data set 1 in a computer memory. The spin echo information from the second sequence is stored as data set 2. The echo 2 information in data set 1 is of the form $$(f_A+f_B)\exp\{i\epsilon'_{INST}\}$$

where $f_A$ and $f_B$ are the weighting factors of the A and B components, dependent upon the relaxation times as well as the nuclear density of components A and B. The echo 2 information in data set 2 is of the form $$(f_A+f_B)\exp\{i(2\phi_E+\epsilon'_{INST})\}$$

By complex division of these two terms on a pixel-by-pixel basis a representation of the "field image" is derived:

$$\frac{(f_A+f_B)\exp\{i(2\phi_E+\epsilon'_{INST})\}}{(f_A+f_B)\exp\{i\epsilon'_{INST}\}}$$

or more precisely, by taking the argument of this quotient, an intermediate phase image of the following form is obtained:

$$\phi(x,y)=2\gamma E(x,y)2\tau_s=2\phi_E$$

The field range of $\phi(x,y)$ terms is thereby a spatial phase representation of the magnetic field.

It is now necessary to divide this expression by two to obtain a field image which is equivalent to $\phi_E$ instead of $2\phi_E$. Alternately, one could take the square root of the above complex quotient, thereby yielding an argument of half the original quotient, which is equal to $\phi_E$.

With the field image now set equal to $\phi_E$, correction may then be performed on the echo 1 information of data set 2. This is accomplished by complex multiplication of the image representing echo 1 in data set 2 and the intermediate image representing $\phi_E$. The result of this correction is that the echo 1 data in data set 2 represents an image with a magnitude of $A-B$. The echo 1 data in data set 1 represents an image with a magnitude of $A+b$. The vectors representing these two images are colinear, having a common phase angle of $\epsilon_{INST}$ with respect to the real axis r.

Thereafter, on a pixel-by-pixel basis, a complex sum of these two images is formed. By taking the magnitude of this sum, a magnitude image of the pure component A is formed:

$$|(f_A+f_B)+(f_A-f_B)|=2|f_A|.$$

Similarly, a complex difference of the two images is formed. The magnitude of this difference forms an absolute image of the pure component B:

$$|(f_A+f_B)-(f_A-f_B)|=2|f_B|.$$

Thus one image is produced showing solely the A (e.g., water) component, and a second image is produced showing solely the B (e.g., fat) component. These are the chemical shift images represented at the output (bottom) of the flowchart of FIG. 6.

A further factor should be considered when performing the field image phase correction described above, which is the total phase shift due to field inhomogeneities throughout the image plane. When the $\phi_E$ field is determined at any particular point, it is represented by a complex number with a phase angle in radians. This phase angle can only be represented in values within a $2\pi$ radian range; in practice, the range is ideally bounded between $-\pi$ and $+\pi$ radians. However, it is possible for the image to have true phase values exceeding several of these ranges, depending upon the chemical shift components being determined and the degree of the magnetic field nonuniformity and the subject being imaged.

In general, there should be no more than a single $2\pi$ radian range in phase values of E(x,y) across the image plane when the field homogeneity over the whole imaging plane is less (in ppm units) than the chemical shift separation ($\Delta\sigma$) of the two chemical shift components. For example, in FIG. 1, the exemplary chemical shift components have a $\Delta\pi$ separation of 3.5 ppm. Suppose then the field at one edge of an image plane was measured and found to be 6112.512 Gauss, and the field at the opposite edge of the image plane was found to be 6112.521 Gauss. The difference of these two figures is 0.009 Gauss. Dividing this number by 6112.512 Gauss and multiplying the result by $10^6$ ("million") gives a final field inhomogeneity figure from edge to edge to 1.47 ppm. Since 1.47 ppm is less than the $\Delta\sigma$ separation of 3.5 ppm, such a field would not be expected to lead to problems during phase correction.

But suppose that the second measurement were found to be 6112.561 Gauss instead of 6112.521 Gauss. Now the difference between the two edge values is 0.049 Gauss. Dividing this number by 6112.512 Gauss and multiplying by $10^6$ gives a field figure of 8.02 ppm, indicating problems during phase correction.

Figure 7:
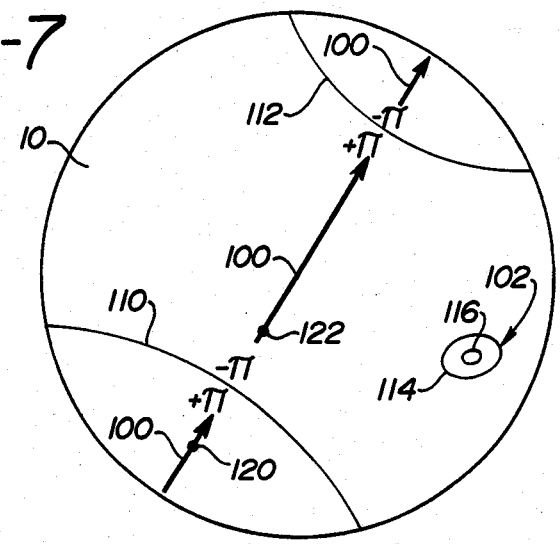
FIG. 7 illustrates field inhomogeneity effects across an image plane.

The nature of the problems may be understood by referring to image plane 10 of FIG. 7. In the image plane 10 a steady continuum of increasing field inhomogeneity extends from the lower left hand edge to the upper right hand edge as represented by arrows 100. One complete range of phase values from $-\pi$ to $+90$ radians is shown in the middle of the image. This range is separated from adjacent ranges at range boundaries 110 and 112.

Figure 8:
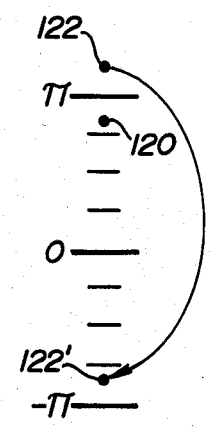
FIG. 8 illustrates a phase range table associated with FIG. 7.

The complex numerical terms of $\phi_E$ may be found as described above for any point along the continuum, and the phase angle for any term will be within a range of $+\pi$ to $-\pi$ radians. The $\phi_E$ terms are of the form $$\exp\{i\gamma E(x,y)4\tau_s\}$$

which may be exponentially reduced to $$\phi(x,y) \propto \gamma E(x,y)4\tau_s$$

where E(x,y) contains a phase angle term in the range of $-\pi$ to $+\pi$ radians. However, the phase angle terms will not distinguish which range they are in. For instance, point 120 in FIG. 7 is located in a range just below boundary 110 where the range maximum of $+\pi$ is located. In the range table of FIG. 8, the phase of point 120 would be located as there indicated. Proceeding up the continuum and across boundary 110 in FIG. 7 a point 122 is found. In absolute terms, this point would have a phase value in excess of the $+\pi$ boundary value; perhaps a value such as $+\pi+(\pi/5)$ radians. In the range table of FIG. 8, this phase value is as shown by point 122. However, this is above the upper limit $+\pi$ of the range table, and this phase value would therefore "wrap around" and be found as shown at point 122' as a value of $-\pi+(\pi/5)$ radians. This is seen to correspond to the value of point 122 in the center range of FIG. 7, where it is a location just above $-\pi$ at boundary 110. Similar wrap around would occur in the vicinity of boundary 112.

This wrap around problem creates ambiguity in the complex numerical terms of the data set comprising the field image $\phi_E$. One way in which the ambiguity manifests itself is when the $2\phi_E$ data set from data set 2, echo 2 is to be divided by two to produce the $\phi_E$ intermediate field image for correction. Since the numbers in the data set are complex and there is a factor of 2 in the exponential, the mathematical function performed is in actuality a square root taken of complex numbers. The result of this square root function will be indeterminate when the set of data values encompasses more than one $2\pi$ radian range.

Furthermore, even an edge-to-edge measurement finding an acceptably low ppm figure is misleading. Every image may be expected to have regions where the rate of change of the field inhomogeneity increases or decreases, in effect producing "hills and valleys" in a map of the phase field. One such typical region is indicated at 102 in FIG. 7, where range boundaries 114 and 116 appear in quick, circular succession. Rates of field change can also increase through one region, then decrease through the next. For instance, in a transverse image through the human abdomen containing a portion of the liver, a sudden increase in the rate of field change was found in the vicinity of the liver. It is speculated that this phenomenon may be due to the high concentration of ferrous ions in the liver and the resultant effect of these ions on the local magnetic field. In any event, every living subject may be expected to have its own unique phase characteristics for any given image plane.

To solve the wrap around problem, the field must be "unwrapped". Unwrapping is achieved by picking a starting reference point in the field map data set, then plotting, point by point, the change in the field from one point to an adjacent point. Preferably, the point by point comparison should be done both horizontally and vertically through the field map so that the "hills and valleys" are all properly detected. As phase change values accumulate to a $+\pi$ or $-\pi$ value at a boundary, a boundary crossing will be detected. A numerical correction of multiples of $\pm 2\pi$ radians for subsequent points across the boundary would then be applied to these points, thereby indicating that the subsequent points are in a different $2\pi$ range. When the process is complete, the numerical correction factors are added or subtracted as appropriate to their respective phase value data points. If the process was performed properly, the result of this correction is a smoothly varying field map. By taking the respective correction factors into consideration when the complex numerical computations are performed, the results of each computation will be a determinate number. Without unwrapping, for instance, portions of the A component image will appear in the B component image, and vice versa, when the vectorial sums and differences are taken for image formation.

In the preferred embodiment it has been shown how chemical shift images may be produced from two multi-spin echo sequences, the latter rotating the desired component vectors by 180° and 360°. However, it is also possible to form the desired images using single spin echo sequences and at other vector orientations. For instance, a first spin echo experiment can be performed in the conventional manner, with the 180° RF pulse coincident in time with $\frac{1}{2}T_E$. A second experiment is performed with the 180° RF pulse time shifted with respect to $\frac{1}{2}T_E$ so that at time $T_E$ the chemical shift components are rotated with respect to each other by some multiple of $\pi$ radians, e.g., 180°. In a third experiment, the 180° RF pulse time is shifted with respect to $\frac{1}{2}T_E$ such that at time $T_E$ the chemical shift components are rotated with respect to each other by some multiple of $2\pi$ radians, e.g., 360°. The signal information acquired in the three experiments will exhibit comparable $\epsilon_{INST}$ terms, thereby permitting identification of the field inhomogeneity information $\phi_E$ by combining the image data sets of the first and third experiments. The $\phi_E$ information is then used to remove the field inhomogeneity factor from the second image data set, and the first image data set and the corrected second image data set may then be combined to produce separate images of the two chemical shift components. This particular embodiment will find application principally in NMR imaging systems with low field strengths. In such systems, the technique of the preferred embodiment of FIGS. 4–6 would require $T_E$ times of such long duration that, due to the generally short $T_2$ weighting in in vivo tissue, the signal strengths would be undesirably weak. The three single echo technique thus would provide a higher signal-to-noise field correction image, but at the expense of greater image acquisition time. The multiple spin echo technique of the preferred embodiment is more desirable in most applications because only two experiments are required, which makes the total imaging time equivalent to that of the Dixon technique. The multiple spin echo technique is preferable because the first spin echo signals of each sequence will yield chemical shift separation information and the second spin echo signals will yield field correction information. The necessary information for correction and presentation is thus acquired quickly and efficiently.

It is also possible to use other chemical shift component vector orientations, such as a quadrature ($\theta = 90°$) vector orientation. In such a technique, the $2\tau_s$ spin echo sequence is performed, setting $2\tau_s$ to the appropriate value to obtain angle $\theta = 90°$ between the two chemical shift vectors, as shown in FIG. 9. The $\epsilon_{INST}$ phase error and the $\phi_E$ phase error can be eliminated as described above, using a $\phi_E$ corrected field image and an image containing $\epsilon_{INST}$. Through quadrature detection and resolution, the A and B components can be found and separately imaged by using the real and imaginary components of the corrected image information.

Rather than obtaining the $\phi_E$ field image information in situ, that is, from the subject itself, it is also possible to obtain the field correction information from a phantom object. The $\phi_E$ field image data obtained by imaging the phantom, such as a single-component water phantom, would then be used to correct the spin echo information acquired from the subject. In such a case, each sequence could be a single echo sequence. However it is preferable to obtain the $\phi_E$ field image information in situ from the actual subject. As previously discussed, unique field effects of the subject, such as the phase phenomena of the liver, would not be duplicated in the phantom and could result in less optimally corrected images.

Finally, the techniques of the present invention are applicable in situations where it is desirable to map the field inhomogeneity in the magnetic field of an NMR system. The $\phi_E$ field image information itself is useful when information as to the presence of field inhomogeneities, either in a phantom or in situ, is sought, since its two dimensional presentation is a map of the magnetic field of the instrument.

Apparatus useful for performing the techniques of the present invention is shown and described in FIGS. 1 and 2 of U.S. patent application Ser. No. 550,523, filed Nov. 9, 1983 and entitled "COMPLEX QUOTIENT NUCLEAR MAGNETIC RESONANCE IMAGING." That application also describes various techniques for complex number processing and imaging.

What is claimed is:

1. A method for identifying chemical shift information in the presence of field inhomogeneities in an NMR information signal comprising the steps of:
   (a) obtaining a first data set of NMR signal information which contains substantially no chemical shift and magnetic field inhomogeneity information;
   (b) obtaining a second data set of NMR signal information which contains chemical shift and field inhomogeneity information;
   (c) obtaining a third data set of NMR signal information which contains field inhomogeneity information;
   (d) combining the first and third data sets to identify the field inhomogeneity information; and
   (e) using the identified field inhomogeneity information in combination with the second data set to identify the chemical shift information.

2. The method of claim 1, further comprising the step of:
   (f) reconstructing images using the three data sets;
   and wherein steps (d) and (e) comprise:
   (d) combining the image data of the first and third data sets to form a field image which identifies the field inhomogeneity information; and
   (e) using the field image in combination with the image data of the second data set to identify the chemical shift information.

3. The method of claim 2, further comprising the steps of:
   (g) forming a complex sum of the large data of the first data set and the image data of the second data set in which the chemical shift information has been identified; and
   (h) taking the magnitude of the complex sum to produce a magnitude image of one chemical shift component.

4. The method of claim 2, further comprising the steps of:
   (i) forming a complex difference of the image data of the first data set and the image data of the second data set in which the chemical shift information has been identified; and (j) taking the magnitude of the complex difference to produce a magnitude image of a second chemical shift component.

5. A method for identifying chemical shift information in the presence of field inhomogeneities in an NMR information signal comprising the steps of:

(a) obtaining a first data set of NMR signal information in which two chemical shift components are oriented at a first angle relative to each other and which contains substantially no magnetic field inhomogeneity information;

(b) obtaining a second data set of NMR signal information in which said two chemical shift components are oriented at a second angle relative to each other and which contains field inhomogeneity information;

(c) obtaining a third data set of NMR signal information in which said two chemical shift components are oriented at said first angle relative to each other and which contains field inhomogeneity information;

(d) combining the first and third data sets to identify the field inhomogeneity information: and (e) using the identified field inhomogeneity information in combination with the second data set to correct the second data set by eliminating the field inhomogeneity information, thereby identifying said two chemical shift components which are oriented at said second angle.

6. The method of claim 5, further comprising the step of:

(f) reconstructing images using the three data sets: and wherein steps (d) and (e) comprise:

(d) combining the image data of the first and third data sets to form a field image which identifies the field inhomogeneity information: and (e) using the field image in combination with the image date of the second data set to form a corrected second image which eliminates the field inhomogeneity information, thereby identifying said two chemical shift components which are oriented at said second angle.

7. The method of claim 6, further comprising the steps of:

(g) forming a complex sum of the image data of the first data set and the corrected second image; and (h) taking the magnitude of the complex sum to produce a magnitude image of one chemical shift component.

8. The method of claim 6, further comprising the steps of:

(i) forming a complex difference of the image data of the first data set and the corrected second image; and (j) taking the magnitude of the complex difference to produce a magnitude image of a second chemical shift component.

9. The method of claim 6, wherein said first angle is substantially equal to zero radians, and said second angle is substantially equal to $\pi$ radians.

10. A method for obtaining field inhomogeneity corrected NMR information in an NMR environment comprising the steps of:

(a) performing a first NMR multi-echo signal acquisition sequence with RF pulse tip angles and time intervals between RF pulses and the time of signal acquisition chosen to yield first and second data sets of NMR signal information, each set being substantially free of field inhomogeneity effects and each set exhibiting a characteristic set of instrumentation error signal components;

(b) performing a second NMR multi-echo signal acquisition sequence to yield third and fourth data sets of NMR signal information, with RF pulse tip angles and time intervals between RF pulses and the time of signal acquisition being chosen to elicit field inhomogeneity signal components and a characteristic set of instrumentation error signal components in each data set;

(c) combining said second and fourth data sets to identify said field inhomogeneity signal components; and (d) using the identified field inhomogeneity signal components in combination with the third data set to correct the third data set for field inhomogeneities.

11. The method of claim 10, wherein said third data set contains chemical shift information, and wherein step (d) comprises:

(d) using the identified field inhomogeneity signal components in combination with the third data set to identify chemical shift information by correcting the third data set for field inhomogeneities.

12. The method of claim 11, wherein in step (a), said first data set contains two chemical shift components oriented at a first angle relative to each other; and wherein in step (b), said third data set contains two chemical shift components oriented at a second angle relative to each other.

13. The method of claim 12, further comprising the step of:

(e) reconstructing images using the four data sets; and wherein steps (c) and (d) comprise:

(c) combining the image data of the second and fourth data sets to form a field image which identifies the field inhomogeneity signal components; and (d) using the field image in combination with the image data of the third data set to form a corrected third image which is corrected for field inhomogeneities.

14. The method of claim 13, further comprising the steps of:

(f) forming a complex sum of the image data of the first data set and the corrected third image; and (g) taking the magnitude of the complex sum to produce a magnitude image of one chemical shift component.

15. The method of claim 13, further comprising the steps of:

(h) forming a complex difference of the image data of the first data set and the corrected third image; and (i) taking the magnitude of the complex difference to produce a magnitude image of a second chemical shift component.

16. A method for detecting field inhomogeneity information phase angle ranges in an NMR environment comprising the steps of:

(a) obtaining a first data set of NMR signal information which contains virtually no field inhomogeneity information;

(b) obtaining a second data set of NMR signal information which contains a characteristic set of field inhomogeneity components, said field inhomogeneity components each including a phase angle value;
(c) combining said first and second data sets to identify said field inhomogeneity components;
(d) picking a phase angle value of one of said components which is within a reference range of contiguous phase angle values; and
(e) comparing said phase angle values to detect phase angles which are within ranges other than said reference range.

17. The method of claim 16, wherein each range has a magnitude of $2\pi$ radians, and further comprising the step of:
(f) compiling numerical corrections of multiples of $\pm 2\pi$ for field inhomogeneity components which contain phase angle values which are within ranges other than said reference range.

18. A method for identifying chemical shift information in an NMR environment comprising the steps of:
(a) obtaining a first image data set of NMR signal information in which two chemical shift components are oriented relative to each other at a first angle;
(b) obtaining a second image data set of NMR signal information in which two chemical shift components are oriented relative to each other at a second angle, wherein said second image data set contains spatially variable field inhomogeneity components;
(c) obtaining a field map containing phase angle values representing spatially varying field inhomogeneity;
(d) combining said field map with said second image data set to produce a second image corrected for field inhomogeneities; and
(e) combining said first image data set and said corrected second image to identify said chemical shift components.

19. The method of claim 18, wherein steps (a) and (b) comprise:
(a) obtaining a first image data set of NMR signal information in which two chemical shift components are oriented relative to each other at an angle of $n(2\pi)$ where n is an integer number or zero; and
(b) obtaining a second image data set of NMR signal information in which two chemical shift components are oriented relative to each other at an angle of $M\pi$, where m is an odd integer number, wherein said second image data set contains spatially variable field inhomogeneity components.

20. The method of claim 18, wherein steps (a) and (b) comprise:
(a) obtaining a first image data set of NMR signal information in which two chemical shift components are oriented relative to each other at an angle of $n(\pi/2)$, where n is a first integer number, and
(b) obtaining a second image data set of NMR signal information in which two chemical shift components are oriented relative to each other at an angle of $m(\pi/2)$, where m is a second integer number, wherein said second image data set contains spatially variable field inhomogeneity components.

21. The method of claim 18, further comprising the steps of:
(f) forming complex sums and differences of the first image data set and the corrected second image; and
(g) taking the magnitude of the complex sums and differences to produce magnitude images of said chemical shift components.

22. The method of claim 21, further comprising a step (h) following step (c) of
(h) unwrapping said field map when the variation in field homogeneity is greater than the chemical shift separation of the two chemical shift components.

23. In an NMR system, apparatus for identifying chemical shift information comprising:
means for generating and acquiring first and second sets of spin echo information signals at times $T_E$ and $nT_E$ relative to the time of an RF excitation pulse;
means for generating and acquiring third and fourth sets of spin echo information signals at times offset from times $T_E$ and $nT_E$ by multiples of an offset time $\tau_s$;
means for combining the second and fourth sets of spin echo information signals to produce a data set representative of field inhomogeneity; and
means for combining the field inhomogeneity data set and the third set of spin echo information signals to identify chemical shift information.

24. The arrangement of claim 23, further comprising:
means for combining the third set of spin echo information signals in which the chemical shift information has been identified and the first set of spin echo information signals to separately identify components of chemical shift information.

* * * * *